United States Patent
Hsu et al.

(10) Patent No.: US 6,556,481 B1
(45) Date of Patent: Apr. 29, 2003

(54) 3-STEP WRITE OPERATION NONVOLATILE SEMICONDUCTOR ONE-TRANSISTOR, NOR-TYPE FLASH EEPROM MEMORY CELL

(75) Inventors: Fu-Chang Hsu, San Jose, CA (US); Hsing-Ya Tsao, San Jose, CA (US); Peter W. Lee, Saratoga, CA (US); Mervyn Wong, El Cerrito, CA (US)

(73) Assignee: Aplus Flash Technology, Inc., San Jose, CA (US)

( * ) Notice: Subject to any disclaimer, the term of this patent is extended or adjusted under 35 U.S.C. 154(b) by 0 days.

(21) Appl. No.: 09/852,247

(22) Filed: May 9, 2001

Related U.S. Application Data (60) Provisional application No. 60/270,422, filed on Feb. 21, 2001.

(51) Int. Cl.$^7$ .............................................. G11C 16/04
(52) U.S. Cl. .............................. 365/185.24; 365/185.2; 365/185.28; 365/185.29
(58) Field of Search .......................... 365/185.2, 185.17, 365/185.18, 185.19, 185.24, 185.29, 185.33, 185.28

(56) References Cited

U.S. PATENT DOCUMENTS

| | | | | |
|---|---|---|---|---|
| 5,464,998 A | | 11/1995 | Hayakawa et al. | 257/316 |
| 5,696,718 A | * | 12/1997 | Hartmann | 365/185.18 |
| 5,712,815 A | | 1/1998 | Bill et al. | 365/185.03 |
| 5,757,699 A | | 5/1998 | Takeshima et al. | 365/185.24 |
| 5,790,456 A | | 8/1998 | Haddad | 365/185.17 |
| 5,814,854 A | * | 9/1998 | Liu | 257/315 |
| 5,825,689 A | | 10/1998 | Wakita | 365/185.11 |
| 5,892,713 A | | 4/1999 | Jyouno et al. | 365/185.11 |
| 5,959,882 A | | 9/1999 | Yoshida et al. | 365/185.03 |
| 5,982,668 A | | 11/1999 | Ishii et al. | 365/185.24 |
| 6,009,016 A | | 12/1999 | Ishii et al. | 365/185.24 |
| 6,011,715 A | | 1/2000 | Pasotti et al. | 365/185.03 |
| 6,011,725 A | * | 1/2000 | Eitan | 365/131 |
| 6,038,170 A | | 3/2000 | Shiba | 365/185.13 |
| 6,072,722 A | * | 6/2000 | Hirano | 365/185.13 |
| 6,101,123 A | | 8/2000 | Kato et al. | 365/185.11 |
| 6,330,192 B1 | * | 12/2001 | Ohba et al. | 365/185.22 |
| 6,404,681 B1 | * | 6/2002 | Hirano | 365/185.11 |

* cited by examiner

*Primary Examiner*—Richard Elms
*Assistant Examiner*—Hien Nguyen
(74) *Attorney, Agent, or Firm*—George O. Saile; Stephen B. Ackerman

(57) ABSTRACT

In the present invention a three step write of a nonvolatile single transistor cell is disclosed. The three steps comprise erasing, reverse programming and programming which can be applied to a plurality of cell types to produce a symmetrical design and allowing shrinkage of the cell beyond that which is possible with other cells designed to use a two step write procedure. The methodology can be applied to either N-channel or P-channel devices and can be used on various type memory cells such as "ETOX", "NOR" type, "AND" type, and "OR" type. Erasing and programming steps increase the Vt of the cell transistor, whereas reverse programming decreases the Vt of the cell transistor. Over-erase problems are eliminated using the three step write procedure.

22 Claims, 9 Drawing Sheets

10- control gate
11- floating gate
22- shallow junction
13- shallow junction
14- ONO
15- tunnel oxide
16- p-substrate
37- channel erase
38- channel reverse-program
39- channel program

10- control gate
11- floating gate
12- deep junction
20- lightly doped n-
13- shallow junction
14- ONO
15- tunnel oxide
16- p-substrate
17- p+ implant
18- channel erase
19- edge program

FIG.1 (Prior Art)

10- control gate
11- floating gate
22- shallow junction
13- shallow junction
14- ONO
15- tunnel oxide
16- p-substrate
27- channel erase
28- channel program

- 10- control gate
- 11- floating gate
- 22- shallow junction
- 13- shallow junction
- 14- ONO
- 15- tunnel oxide
- 37- channel erase
- 38- channel reverse-program
- 39- channel program
- 40- p-well
- 41- deep n-well
- 16- p-substrate

FIG.5

10- control gate
11- floating gate
22- shallow junction
33- deep junction
34- lightly doped n-
44- p+ implant
14- ONO
15- tunnel oxide
16- p-substrate
48- edge erase
49- CHE program

FIG.6 (Prior Art)

10- control gate
11- floating gate
22- shallow junction
13- shallow junction
44- p+ implant
14- ONO
15- tunnel oxide
16- p-substrate
37- channel erase
38- channel reverse-
    program
49- CHE program

FIG.7

- 10- control gate
- 11- floating gate
- 22- shallow junction
- 33- deep junction
- 34- lightly doped n-
- 44- p+ implant
- 14- ONO
- 15- tunnel oxide
- 48- edge erase
- 49- CHE program
- 40- p-well
- 41- deep n-well
- 16- p-substrate

FIG.8 (Prior Art)

- 10- control gate
- 11- floating gate
- 22- shallow junction
- 13- shallow junction
- 44- p+ implant
- 14- ONO
- 15- tunnel oxide
- 37- channel erase
- 38- channel reverse-program
- 49- CHE program
- 40- p-well
- 41- deep n-well
- 16- p-substrate

- 10- control gate
- 11- floating gate
- 52- shallow junction
- 53- shallow junction
- 14- ONO
- 15- tunnel oxide
- 16- p-substrate
- 37- channel erase
- 38- channel reverse-program
- 39- channel program
- 41- nwell

| | FIG.12a (Prior Art) AND | FIG.12b (Prior Art) AND | FIG.12c NOR, OR |
|---|---|---|---|
| Erase | Channel | Channel | Channel |
| Program | Edge | Channel | Channel |
| Vt after erase | increased → | decreased → | increased ← |
| Vt after program | decreased ← | increased ← | increased ← |
| Symmetrical cell | No | Yes | Yes |
| Over-erase-free | Yes | No | Yes |

3-STEP WRITE OPERATION NONVOLATILE SEMICONDUCTOR ONE-TRANSISTOR, NOR-TYPE FLASH EEPROM MEMORY CELL

This application claims the benefit of Provisional Application No. 60/270,422 filed Feb. 21, 2001.

RELATED APPLICATIONS

This application is related to AP01-001.2, Ser. No. 09/891,782 filed on Jun. 27, 2001, and assigned to a common assignee.

BACKGROUND OF THE INVENTION

1. Field of the Invention

The invention relates to semiconductor memories and in particular to channel erase and program for a semiconductor nonvolatile device such as a one-transistor, NOR-type semiconductor integrated circuit device comprising a flash electrically erasable programmable read only memory (EEPROM).

2. Description of the Related Art

In today's leading flash EEPROM technology, a plurality of one-transistor EEPROM cells has been configured into either NAND-type or NOR-type arrays. For NAND-type cell array, the flash cells' sources and drains are mutually connected in series to save die size for the reason of cost reduction. In contrast, for NOR-type cell array, the cells' drains and sources are connected in parallel to respective bit lines and source lines to achieve high read speed at sacrifice of die size increase. It is well known that the NAND-type cell array suffers no over-erase problem due to its unique array structure allowing no leakage path during read. For one-transistor (non-split gate) NOR-type cell array, the over-erase problem may or may not occur and is fully subject to the choice of erase and program methods. Conventionally, program is performed on the basis of bit-by-bit method but erase is performed collectively on all cells of the block. In either NOR-type or NAND-type flash memory, the entire flash chip is divided into several blocks. Typically, the size of each flash block ranges from 64 Kbits to 512 Kbits. The erase operation is normally performed prior to program operation. In NAND-type flash memory, the erase is performed by block(sector) basis and program is performed by page basis. A page is usually defined as a word line and a block is defined as many word lines which share common bit lines within the same divided block. Although several methods of erase and program operations have been proposed before, in the current NAND-type flash memory, the definition of erase and program operations is unified. The erase operation is to decrease the Vt of the cells that are physically connected to the same erased word line or the word lines in the same block. In contrast, the program operation is to increase Vt of cells of selected erased word line or word lines in the selected block. The non-selected cells in the non-selected word lines in the selected block or the non-selected blocks remain undisturbed.

The following U.S. patents of prior art are directed toward the detailed description of NAND type flash EPROM's.

A) U.S. Pat. No. 6,038,170 (Shiba) is directed toward a nonvolatile memory of a hierarchical bit line structure having hierarchical bit lines which includes a plurality of sub-bit lines.

B) U.S. Pat. No. 5,464,998 (Hayakawa et al.) is directed toward a non-volatile semiconductor memory device including NAND type memory cells arranged in a matrix pattern over a semiconductor substrate.

Up to the present, the definitions of erase and program operation for one-transistor NOR-type flash memory remain inconsistent. Erase could be defined to increase the Vt of the cells and program to decrease the Vt of the cells or vise versa depending on preferable flash technology and its design techniques. The following is a summary of erase and program operations for state of the art one-transistor (non-split-gate) NOR-type flash EEPROM technologies.

1) Fowler-Nordheim (F-N) edge-erase, CHE edge-program, One-Transistor, NOR-type flash EEPROM technology. The typical example is an ETOXTM flash cell. In this prior art, the program is performed on bit-by-bit basis to increase cell's Vt by using CHE (Channel-Hot-Electron) method while erase is performed on block basis to decrease cell's Vt by using FN-tunneling method. The CHE program consumes more than 300 $\mu$A per bit, therefore only a few bits can be programmed at a time by an on-chip charge pump of economic area. Unlike CHE, FN-tunneling erase requires only 10 nA per flash cell so that a big block size of 512 Kb can be erased simultaneously. For 3V or lower Vdd operation, about 4 bits of ETOXTM cells are programmed in state-of-the art design. In the CHE operation, hot electrons are injected into cell's floating gate with an increase in Vt. In contrast, for a FN-tunneling operation, the electrons are extracted out of the floating gate with a decrease in Vt. The erase operation is called edge-erase operation, which is done at the edge of the thin tunnel-oxide between the floating gate and the source junction. In this ETOXTM flash cell, the source junction of N+ is used for erase operation only and is made to be much deeper than the drain junction. The source junction of N+ is surrounded with lightly-doped N-implant to reduce the peak electrical field as generated during erase operation at the tunneling edge. The drain junction is formed with shallow N+, with P+ implanted underneath to enhance the electrical field for CHE program. The ETOXTM cell is made non-symmetrical with respect to source and drain junctions of the cell in terms of cell structure and operating conditions; therefore it is very difficult to be shrunk below 0.18 $\mu$m technology for Ultra-high integrated memory.

The key operating conditions for this technology with a cell made on P-substrate are summarized below:

|                     | Source | Gate         | Drain    | Bulk |
|---------------------|--------|--------------|----------|------|
| a) Erase (edge)     | +5 V   | −10 V        | Floating | 0 V  |
| b) Program(channel) | 0 V    | +10 V        | +5 V     | 0 V  |
| c) Read             | 0 V    | Vdd + ΔV     | 1 V      | 0 V  |
|                     | Erase  | Program      |          |      |
| d) Current/per cell | 10 nA  | >300 $\mu$A  |          |      |

The drawbacks of this ETOXTM flash cell are: a) low cell scalability caused by an asymmetrical cell structure with deep source junction, b) high program current caused by the CHE program scheme, c) high erase current caused by the edge-FN scheme with large substrate leakage current, d) severe over-erase issue caused by the decrease in the Vt of the cells during erase operation, and e) severe channel punch-through problem in shorter channel length devices caused by edge erase.

The following U.S. patents of prior art are directed toward the detailed description of ETOXTM flash cell operations:

A) U.S. Pat. No. 5,712,815 (Colin et al.) is directed toward An improved programming structure for performing a program operation in an array of multiple bits-per-cell flash EEPROM memory cells is provided.

B) U.S. Pat. No. 5,790,456 (Haddad) is directed toward an improved method for performing channel hot-carrier programming in an array of multiple bits-per-cell Flash EEPROM memory cells in a NOR memory architecture so as to eliminate program disturb during a programming operation.

C) U.S. Pat. No. 6,011,715 (Pasotti et al.) is directed toward a programming method for a nonvolatile memory which includes several steps that are repeated until a final threshold value is obtained.

D) U.S. Pat. No. 5,825,689 (Wakita) is directed toward a nonvolatile semiconductor memory device including a memory cell array in which the threshold voltage of a transistor constituting the memory cell is the ground potential or less, and the source voltage condition is changed by a source potential setting circuit in accordance with a detection result from a data detecting circuit.

2) FN channel-erase, FN edge-program, one-transistor, NOR-type flash EEPROM technology. The representative example of this type flash is an ANDTM flash cell. Unlike ETOXTM technology, the program is performed on bit-by-bit basis to decrease cell's Vt while erase is performed on block basis to increase cell's Vt. This operation eliminates the over-erase problem of the ETOXTM technology. Both erase and program operations use the FN-tunneling method, which consumes only about 10 nA per bit without taking the much greater substrate current into account. Therefore a large number of flash cells within a big block can be programmed and erased simultaneously by on-chip charge pump of economic area. For single low power supply Vdd of 3V or below, as many as 16 Kb ANDTM cells in a block are programmed and erased simultaneously. The erase operation is carried out by FN channel-erase, and program operation is carried out by FN edge-program. The edge-program is at the drain edge and cell structure is formed by buried N+ bit line and source line. The electrons are injected into cell's floating gate by channel-erase operation with an increase in Vt. In contrast, the electrons are extracted out of the floating gate by edge-program operation with a decrease in Vt. Similarly, in the ANDTM flash cell, the drain junction of N+ is used for program operation only and is made to be much deeper than the source node surrounded with lightly-doped N-implant to reduce the peak electrical field as generated during drain-edge-program operation. The source junction is formed with shallow N+, with P+ implanted underneath to prevent voltage punch-through in short channel region during edge-program operation. Again, the ANDTM cell is made non-symmetrical with respect to source and drain junctions in terms of cell structure and operating conditions. Therefore, it is very difficult to shrink the ANDTM cell below 0.18 $\mu$m technology for ultra-high integrated memory just as with the ETOXTM flash cell.

The key operating conditions for the one transistor ANDTM technology with the cell made on P-substrate are summarized below.

|  | Source | Gate | Drain | Bulk |
| --- | --- | --- | --- | --- |
| a) Erase (channel) | +0 V | +15 V | 0 V | 0 V |
| b) Program(drain edge) | Floating | −10 V | +5 V | 0 V |
| c) Read | 0 V | Vdd | 1 V | 0 V |
|  | Erase | Program |  |  |
| d) Current/per cell | 10 nA | 10 nA |  |  |

The drawbacks of the ANDTM flash cell are: a) low cell scalability due to asymmetrical cell structure with deeper drain junction; b) high program current due to edge-FN program scheme with huge substrate leakage current; and c) severe channel punch-through problem in shorter channel length cause by edge program operation.

The following U.S. patents of prior art are directed toward the detailed description of ANDTM flash cell operations:

A) U.S. Pat. No. 6,072,722 (Hirano) is directed toward programming and erasing a non-volatile semiconductor storage device.

B) U.S. Pat. No. 6,101,123 (Kato et al.) is directed toward programming and erasing verification of a non-volatile semiconductor memory.

C) U.S. Pat. No. 6,009,016 (Ishii et al.) is directed toward a nonvolatile semiconductor memory which recovers variation in the threshold of a memory cell due to disturbance related to a word line.

D) U.S. Pat. No. 5,982,668 (Ishii et al.) is directed toward a nonvolatile semiconductor memory which recovers variation in the threshold of a memory cell due to disturbance related to a word line. The nonvolatile memory continuously performs many writing operations without carrying out single-sector erasing after each writing operation.

E) U.S. Pat. No. 5,959,882 (Yoshida et al.) is directed toward a nonvolatile semiconductor memory device with a plurality o f threshold voltages set so as to store multi-valued information in one memory cell entitled.

F) U.S. Pat. No. 5,892,713 (Jyouno et al.) is directed toward a configuration that provides a nonvolatile semiconductor memory device which allows high-speed block reading.

G) U.S. Pat. No. 5,757,699 (Takeshima et al.) is directed toward the programming of a selected memory cell which is repeated until the programmed threshold voltage is not greater than a predetermined threshold voltage.

3) FN channel-erase, FN edge-program, One-transistor, NOR-type Flash EEPROM Technology. Like ANDTM flash technology, in this prior art, the program operation is performed on a bit-by-bit basis to decrease cell's Vt while erase is performed on a block basis to increase cell's Vt. Therefore, over-erase is not an issue. Both erase and program operations use the FN-tunneling method, which consumes only about 10 nA per bit without taking the greater substrate current into account. Therefore a large number of flash cells within a big block can be programmed and erased at one time by on-chip charge pump of economic area. For single low power supply Vdd of 3V or below, a larger number of flash cells in a block can be programmed and erased simultaneously as disclosed. In this prior art, the erase operation is carried out by FN channel-erase; program operation is carried out by FN edge-program. The edge-program is at the drain edge but the cell structure is formed by a non-buried N+ bit line and source line. The bit line is a vertical metal line, which connects all drains of the cells in the same block for high read speed. The source lines are tied together by N+ active line, which runs in parallel to the word lines. Each source line is shared by one pair of word lines as in ETOXTM flash cell array. As disclosed in this prior art, the electrons are removed from the floating gate of the cells by drain-edge-FN programming with a decrease in Vt. Conversely, the electrons are injected into the floating gate by channel-erase with an increase in Vt. Similarly, in this flash cell, the drain junction of N+ is used for FN-program operation and is made to be much deeper than source node, surrounding with lightly-doped N-implant to reduce the peak electrical field as generated during drain-edge-program operation. The source junction is formed with shallow N+ with P+ implant underneath to prevent voltage punch-through in short channel region during edge-program operation. Again, this flash cell is made asymmetrical with respect to source and drain junctions in terms of cell structure and operating conditions. Therefore it is again very difficult to be further shrunken for ultra-high integrated memory below 0.18 μm technology.

The key operating conditions for this technology with cell made on P-substrate are summarized below.

|  | Source | Gate | Drain | Bulk |
|---|---|---|---|---|
| a) Erase (channel) | +0 V | +15 V | 0 V | 0 V |
| b) Program(drain-edge) | Floating | −10 V | +5 V | 0 V |
| c) Read | 0 V | Vdd | 1 V | 0 V |
|  | Erase | Program |  |  |
| d) Current/per cell | 10 nA | 10 nA |  |  |

The drawbacks of this type of flash cell are: a) low cell scalability due to asymmetrical cell structure with a deep drain junction; b) high program current due to edge-FN program scheme with a huge substrate leakage current; and c) severe channel punch-through problem in shorter channel lengths due to edge program. The details of this flash cell are disclosed in U.S. Pat. No. 5,708,600 (Hakozaki et al.) which is directed toward a method for writing a multiple value into a nonvolatile memory capable of multiple value data being written into a floating gate type memory cell.

4) FN channel-erase, FN edge-program, one transistor, NOR-type Flash EEPROM technology. This type of flash technology has the same advantage of over-erase-free as the AND™ type flash cell, and provides higher flexibility in erase and program unit size. U.S. Pat. No. 5,748,538 (Lee et al) is commonly assigned to the owner of the present invention and refers to an OR-plane memory cell array. A plurality of transistor cells are arranged in rows and columns to form a flash electrically erasable programmable read only memory (EEPROM). In U.S. Pat. No. 5,848,000 (Lee et al.), commonly assigned to the owner of the present invention, a flash memory address decoder includes a plurality of voltage terminals to receive a plurality of voltages, an address terminal to receive a plurality of address signals and a procedure terminal to receive a procedure signal. The invention includes high accuracy and flexibility to read, erase and program the flash memory.

The key operating conditions for this OR technology with the cell made on P-substrate are summarized below.

|  | Source | Gate | Drain | Bulk |
|---|---|---|---|---|
| a) Erase (channel) | +0 V | +15 V | 0 V | 0 V |
| b) Program(drain edge) | Floating | −10 V | +5 V | 0 V |
| c) Read | 0 V | Vdd | 1 V | 0 V |
|  | Erase | Program |  |  |
| d) Current/per cell | 10 nA | 10 nA |  |  |

SUMMARY OF THE INVENTION

An object of the present invention is to provide a highly scalable flash EEPROM array configuration with the new erase and program schemes.

Another objective of the present invention is to use channel-erase and channel-program operations to remove the high voltage drop across the cell's channel during FN edge-program operation and to permit use of a shorter channel length for ultra high density flash EEPROM memory.

Another further objective of the present invention is to use over-erase-free channel-erase and channel-program operations in the present invention for reliable read, program and erase operations.

Still another objective of the present invention is to provide a new type of channel-erase and channel-program method to write flash EEPROM of either block-size or page-size with immunity from over-erase.

Yet another objective of the present invention is to provide optimal voltages for word lines, bit lines, source lines and P-wells for Vt-increase erase and erase-verify operations so that the selected over-erased cells can be bit-by-bit effectively programmed with a very precise Vt distribution for storing multiple bits per cell.

Yet another further objective of the present invention is to provide optimal voltages for word lines, bit lines, source lines and P-wells for erase, correction, program and inhibit operations so that the disturbance of the Vt of non-selected cells can be eliminated or reduced.

Still yet another objective of the present invention is to provide optimal voltages for word lines, bit lines, source lines and P-wells to provide for a highly-scalable symmetrical cell.

Still yet another further objective of the present invention is to provide the optimal voltages for word lines, bit lines, source lines and P-wells so that the aforesaid drawbacks of severe channel punch-through and program current can be reduced for better life cycle and lower power consumption.

BRIEF DESCRIPTION OF THE DRAWINGS

This invention will be described with reference to the accompanying drawings, wherein.

DETAILED DESCRIPTION OF THE PREFERRED EMBODIMENTS

The preferred embodiment of the present invention will be described with reference to FIG. 1–FIG. 12. A term of "write" operation is frequently used in this description. The definition of a "write" operation means an operation comprising of erase and program operations. In one complete "write" operation, erase is usually performed first followed by a program operation.

Figure 1:
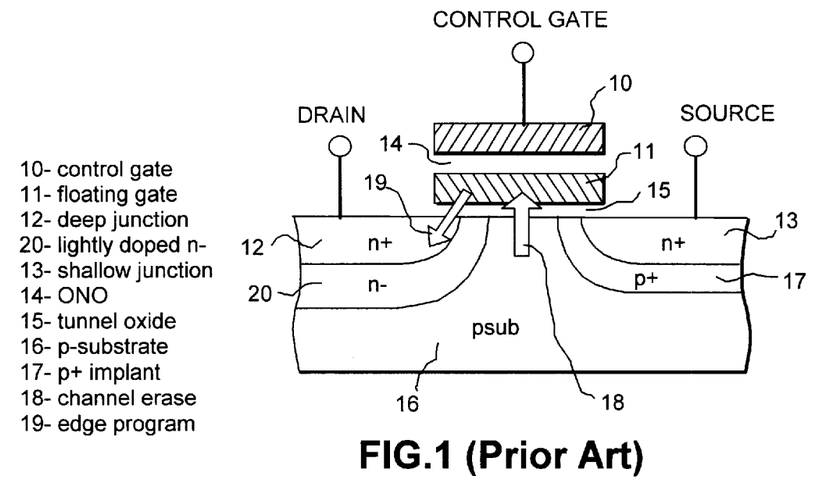
FIG. 1 is a sectional view of a nonvolatile, AND type memory cell of prior art with p+ implant and lightly doped n− implant.

FIG. 1 shows the cross sectional view of a device structure (a transistor structure) of a flash memory cell of a first prior art which is an AND cell with buried N+ source (13), drain (12), control gate (10) and floating gate of (11). The tunnel oxide (15) is formed between floating gate (15) and p-substrate (16). This cell performs channel erase to increase Vt by applying high voltage of about 15V to control gate (10) and ground to source (13) and drain (12). The program operation is performed by applying about −10V to control gate (10), +5V to drain (12) and floating the source (13) in order to decrease Vt. The two arrows with the first (19) aiming from floating gate (11) to the drain (12) indicating an edge program operation, and the other arrow (18) aiming from p-substrate (16) to the floating gate (11) indicating a channel erase operation are shown in FIG. 1. Since the drain node (12) experiences a much higher electric field than the floating source (13) during an FN edge-program operation, the drain junction is made much deeper than source and is lightly doped by n− (20) to avoid junction breakdown. The p+ (17) implant is used to increase the substrate concentration underneath n+ source (13) so that channel punch-through can be prevented. As a result, the cell of prior art shown in FIG. 1 is an asymmetrical flash cell and is hard to shrink further because of the asymmetry.

Figure 2:
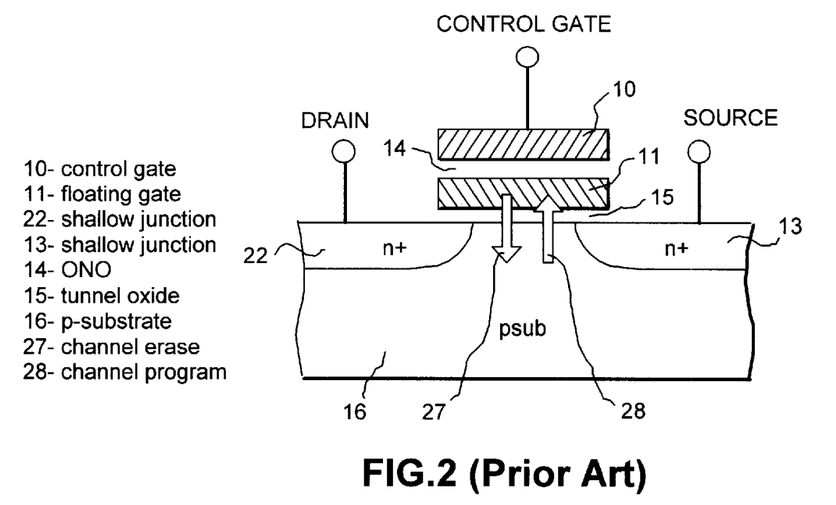
FIG. 2 is a sectional view of a second nonvolatile, AND type memory cell of prior art using a channel erase and channel program operation.

A second prior art shown in FIG. 2 shows a cross sectional view of a symmetrical cell which was disclosed in U.S. Pat. No. 6,072,722. Unlike the cell of the first prior art, the second prior art cell performs both channel-erase and channel-program as indicated by arrows (27 and 28) in FIG. 2. An FN channel-erase (27) is performed to extract electrons out from the floating gate (11) into the p-substrate (16). The FN channel-program (28) is performed to increase the cell's Vt by injecting electrons from the p-substrate (16) into floating gate (11). Since the two operations are performed in channel region, the 5V voltage drop across the channel between the source (13) and the drain (22) in the cell of the first prior art has been removed. As a result, the flash cell in FIG. 2 can be made fully symmetrical with higher cell scalability than the cell in FIG. 1. As shown in FIG. 2, the drain (22) and the source (13) have neither lightly-doped n− nor highly-doped p+. The advantage of this cell structure is simplicity and symmetry, and thus more suitable for ultra high-density flash memory. The drawback is that over-erase becomes a severe problem when cells of FIG. 2 are configured into the NOR-type flash array. The reason for the over-erase problem is a result of the collective block erase operation that decreases the Vt of the cells. That is why the first prior art is designed to increase Vt of the cells during block erase operation.

Figure 3:
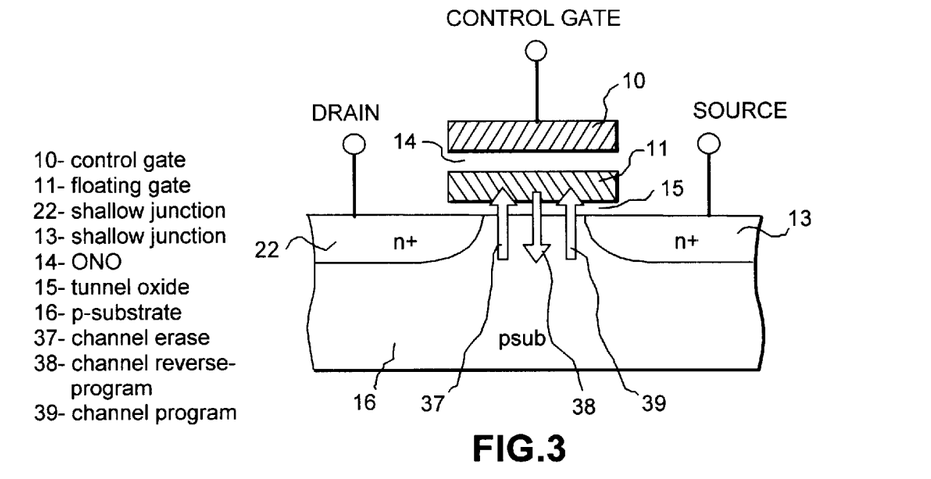
FIG. 3 is a sectional view of a nonvolatile, OR type memory cell of the present invention using a channel erase, a reverse channel program and a channel program.
Figure 4:
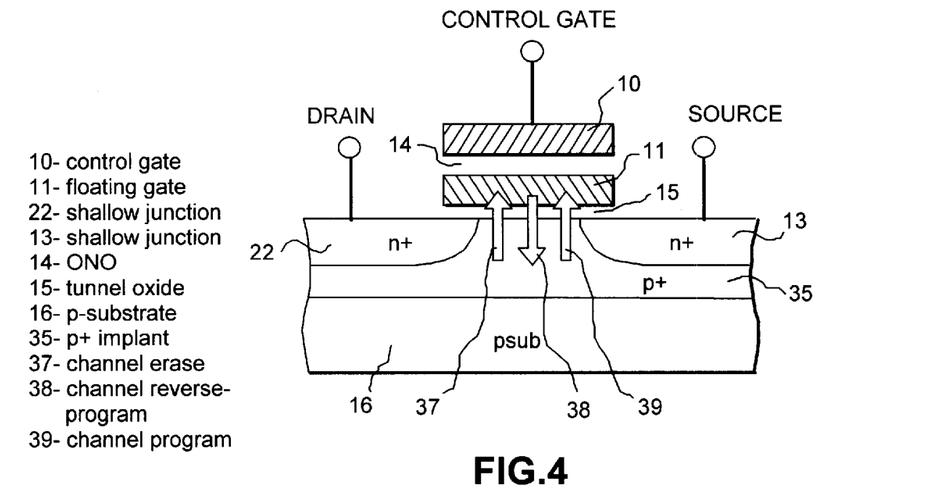
FIG. 4 is a sectional view of a nonvolatile, OR type memory cell of the present invention with a p+ implant and using a channel erase, a reverse channel program and a channel program.

FIG. 3 and FIG. 4 show two cross sectional views of a, one-transistor, symmetrical cell of the present invention with both buried (or non-buried) N+ drain (22) and source (13), control gate (10) and floating gate (11) formed on top of p-substrate (16) with or without p+ (35) in the channel to prevent punch-through when the cell is further shrunken. Either one of these two cells is preferably used for a conventional NOR-type, AND-type, and OR-type flash EEPROM array. Unlike the two-step write operation used commonly in the first and second prior art, the cell of the present invention performs three-step Write operation. An additional channel reverse-program (38) is preferably performed in the midst of channel-erase (37) and channel program (39) as indicated by three arrows in both FIG. 3 and FIG. 4. In the prior art, one complete write operation includes one-step erase and one-step program. In the present invention, two steps of program and one-step of erase operations are sequentially performed in a three-step erase operation. Channel erase (37) and program (39) operations in this three step write are used to increase the Vt of the cells, but reverse program (38) decreases the Vt of the cells. The sequence of the three step write operation is started with channel erase (37), then channel reverse-program (38) and ends with channel program (39). The first two steps can be combined into one step and is referred as the erase operation. In another preferable method of the present invention, the last two steps comprising channel reverse program and program can be combined into one step to be referred as program operation. As a result, both channel erase and channel program are utilized so the flash cell of the present invention can be made fully symmetrical and highly scalable. Moreover, since the block erase increases the cell Vt to be an off-cell, it completely eliminates the over-erase problem in NOR-type, one-transistor flash EEPROM array.

Figure 5:
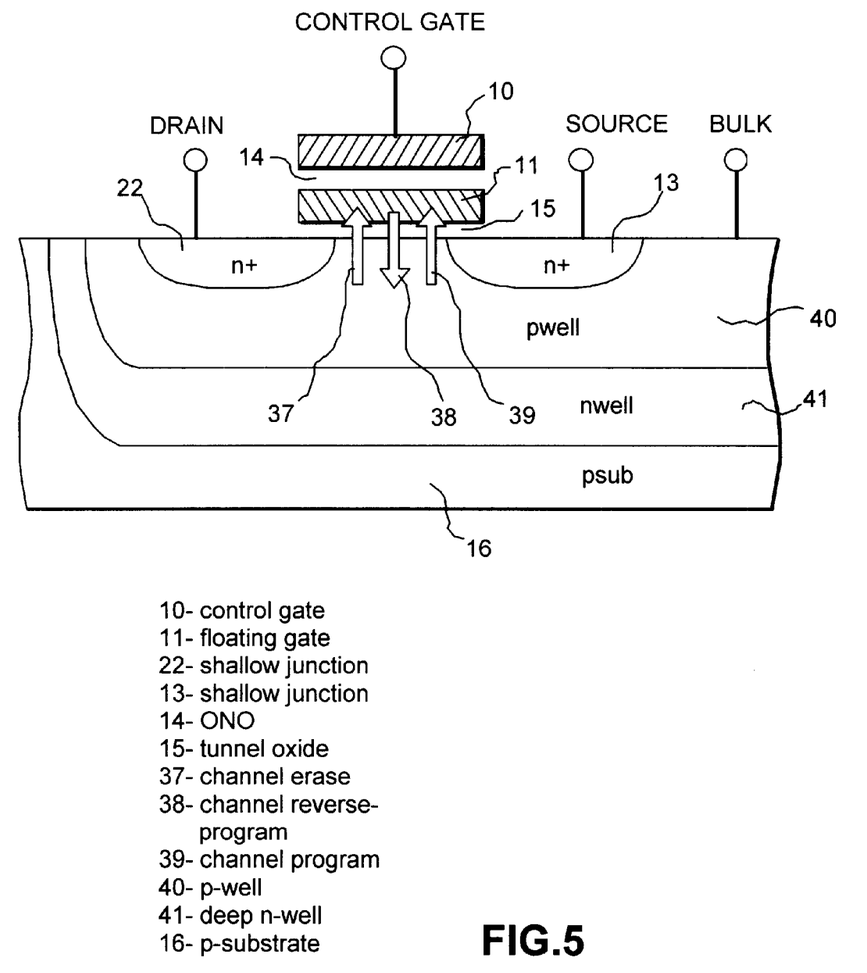
FIG. 5 is a sectional view of a nonvolatile, OR type memory cell of the present invention with a p-well and a deep n-well and using a channel erase, a reverse channel program and a channel program.

FIG. 5 is another embodiment of the present invention employing the three step write operation discussed for FIGS. 3 and 4. The one-transistor, buried n+ drain (22) and buried n+ source (13) are made fully symmetrical residing on p-well (40). The p-well (40) is formed within a deep n-well (41) on p-substrate (16). It should be noted that, although the above example shows the memory device is manufactured with traditional MOS process, it can be also applied to any other technology such as SOI (Silicon-On-insulator) process.

Figure 6:
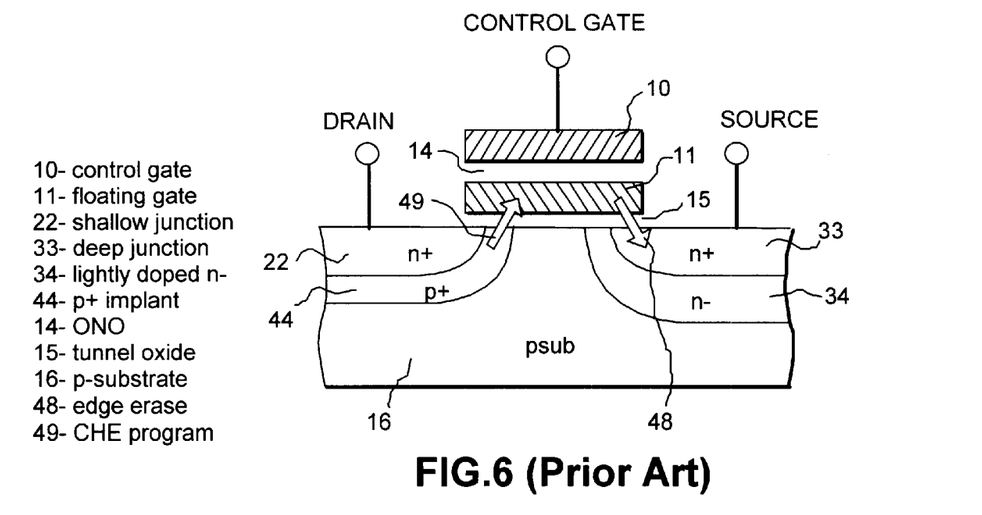
FIG. 6 is a sectional view of a nonvolatile, ETOX type memory cell of prior art with p+ implant and lightly doped n− implant and using an edge erase and a CHE program.

FIG. 6 shows an asymmetrical ETOX cell of prior art formed on p-substrate (16). The n+ drain node (22) is designed to perform a CHE program to increase the Vt of the cell by injecting electrons from drain (22) into floating gate (11) through thin tunnel oxide (15). The n+ source node (33) is a lightly doped n− (34) to perform FN edge-erase (48) as denoted by arrow (15) to extract electrons out from floating gate (11) into source node (33). The p+ (44) underneath n+ drain node (22) is used to enhance the electrical field for the CHE program (49).

Figure 7:
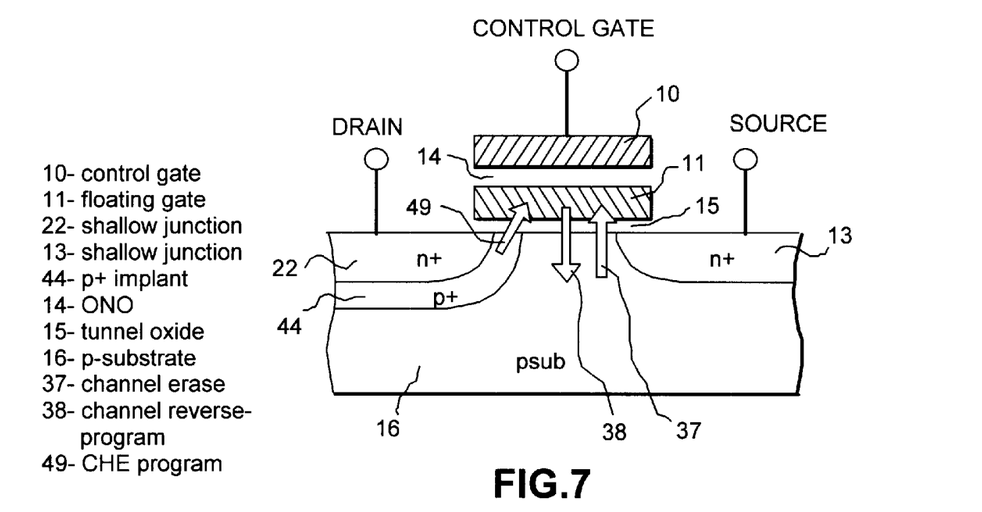
FIG. 7 is a sectional view of a nonvolatile, ETOX type memory cell of the present invention with p+ implant and using channel erase, channel reverse program and CHE program.

FIG. 7 is another embodiment of the present invention employing the three step write operation. The one-transistor, n+ drain (22) and n+ source (13) ETOX cell is made fully symmetrical on p-substrate (16) without a lightly-doped n− as a result of the replacement of the FN edge-erase in FIG. 6 with the FN channel reverse-program (38) in FIG. 7. Unlike the ETOX prior art in FIG. 6, a complete write operation of this embodiment requires a three step operation. The three step operation comprises, one step of FN channel-erase (37), one-step of FN channel reverse-program (38) and the last step of CHE program (49). The preferred sequence of a three step write is firstly started with a block (N word lines) channel-erase (37), then a page (one-word line) channel reverse program (38) and last, ends with a bit-selective CHE program (49) operation. During FN block channel erase (37), all cells in a selected block are erased to high Vt (off-state) to avoid over-erase problem. Then follows a channel reverse program (38) to decrease Vt of the cells in a selected page (one word line). The erased cells, which are in the remaining N−1 word lines of same selected block, remain at high Vt of an off-state. Therefore, after a one page channel reverse program (38), the Vt of the cells are changed from high to low, e.g. from an off-state to an on-state. Because the channel reverse program (38) is performed on one page only, the over-erased cells generated by the reverse program will not cause any problem. These over-erased cells will be programmed back to desired Vt range during the following program operation (49). After FN channel reverse program (38) is carried out on selected page, a CHE program is performed. In another embodiment of the invention, the reverse-program (38) can be performed on the whole block (N word lines) or partial block to bring all the cells on the multiple word lines to a low Vt (on-state) simultaneously.

Figure 8:
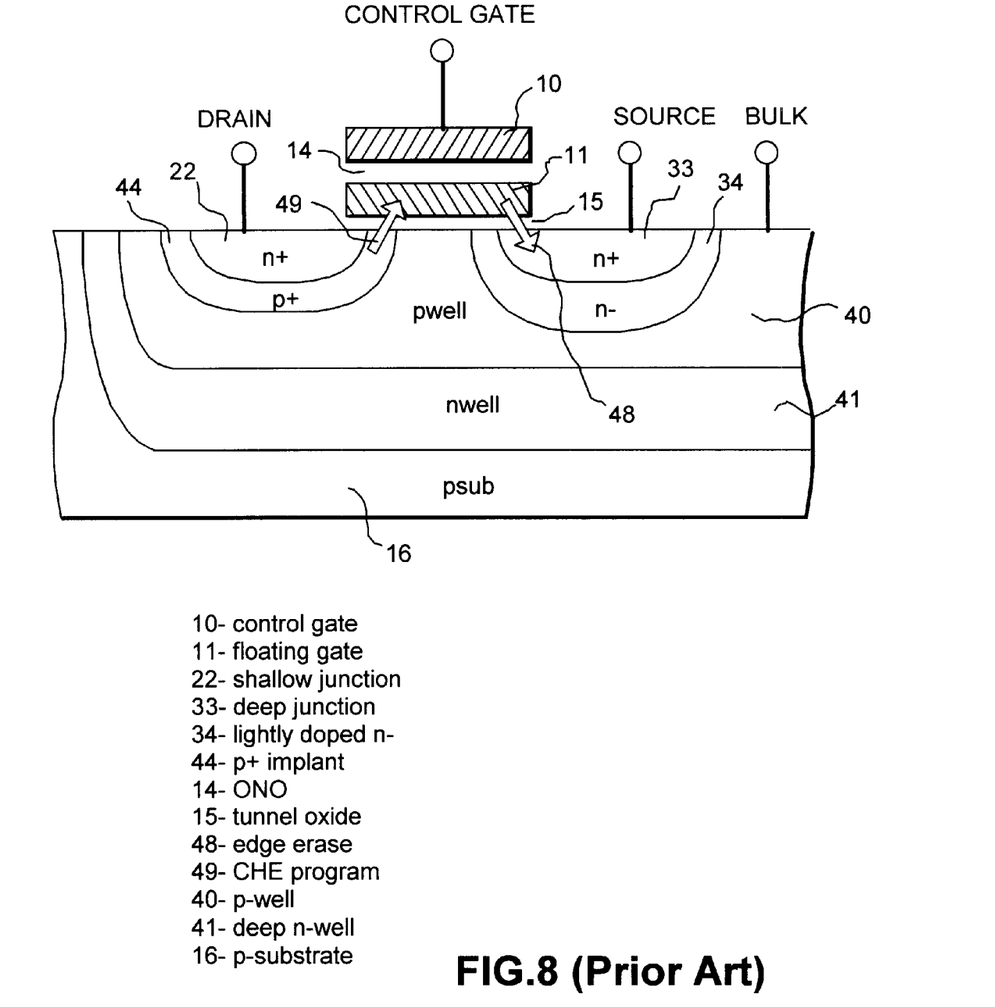
FIG. 8 is a sectional view of a nonvolatile, ETOX type memory cell of prior art with a p+ implant, a lightly-doped n− implant and a p-well within a deep n-well on p-substrate using edge erase and CHE program.

FIG. 8 depicts a flash cell of a second ETOX cell prior art formed on p-well (40). The source (33) and drain (22) are both made of an n+active layer. The p-well (40) is made within an n-well (41) on a p-substrate (16). This cell performs the same CHE program operation like cell of prior art shown in FIG. 6. The erase (48) is performed at the edge between the source junction (33) and the floating gate (15) by using FN tunneling method. The cell of FIG. 6 is formed on p-substrate, whereas the cell in FIG. 8 is formed on p-well (40) within an n-well (41) on top of a p-substrate (16). The operation of cell in FIG. 8 is same as FIG. 6 cell except the p-well needs to be biased properly to avoid breakdown or causing a forward junction.

Figure 9:
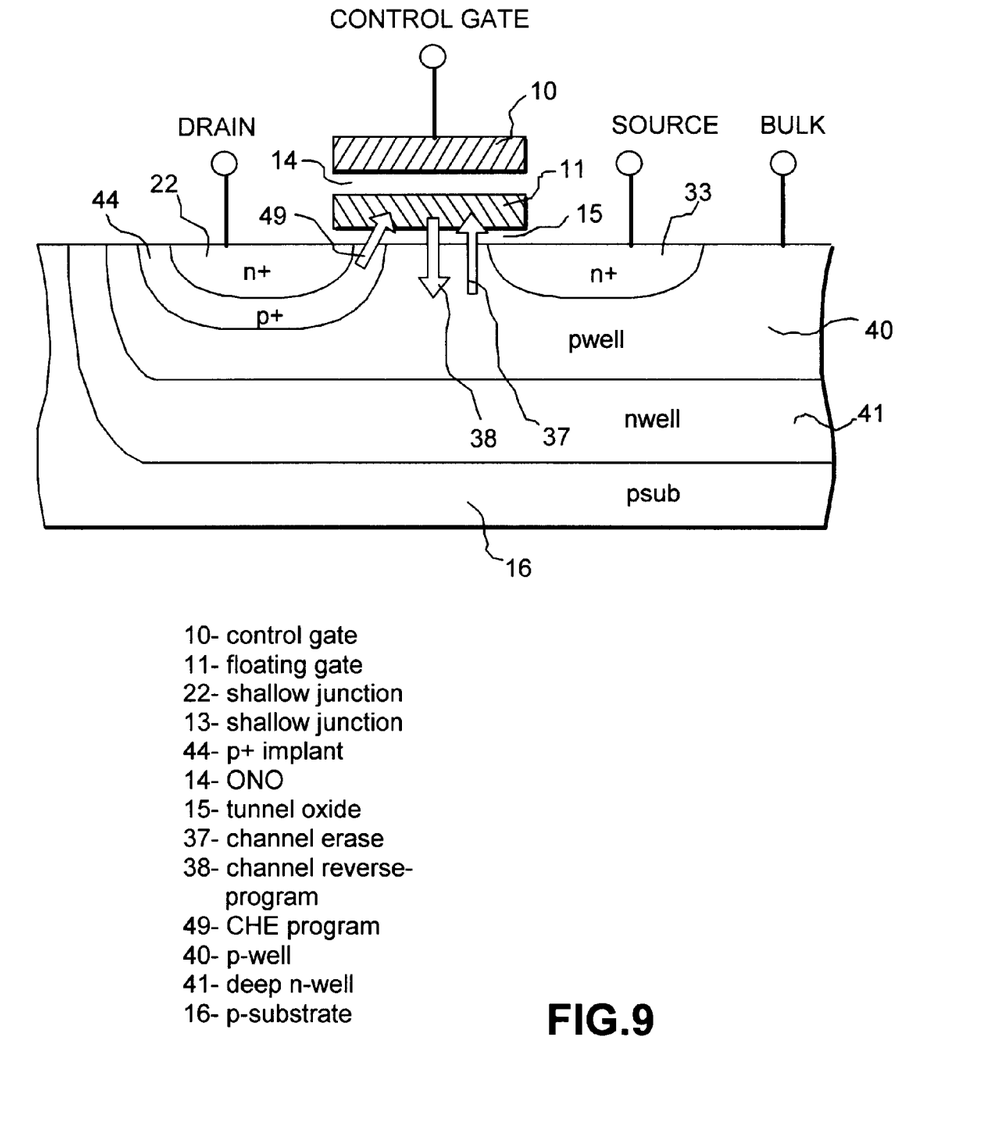
FIG. 9 is a sectional view of a nonvolatile, ETOX type memory cell of the present invention with p+ implant and p-well within a deep n-well on p-substrate and using channel erase, channel reverse program and CHE program.

FIG. 9 depicts another embodiment of the present invention with the cell structure employing the three step write of present invention. The source (33) and drain (22) are both made of an n+ active layer (not a buried n+) and the cell is fabricated on a p-well (40) within an n-well (41) on a p-substrate (16). The cell performs FN channel erase and a CHE program.

Figure 10:
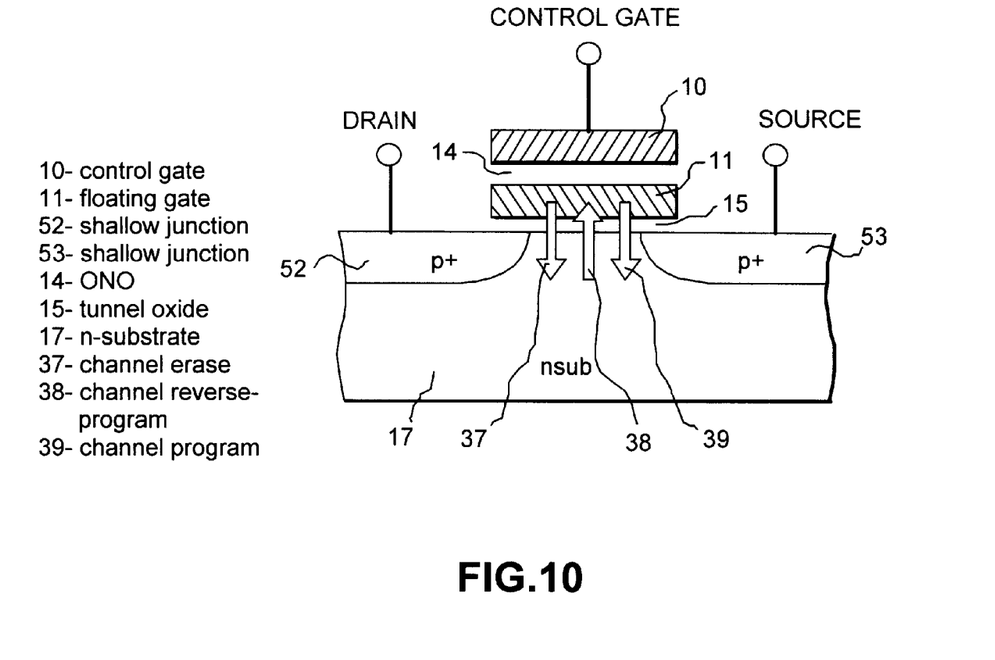
FIG. 10 is a sectional view of a nonvolatile, p+ memory cell of the present invention and using a channel erase, a channel reverse program and a channel program.
Figure 11:
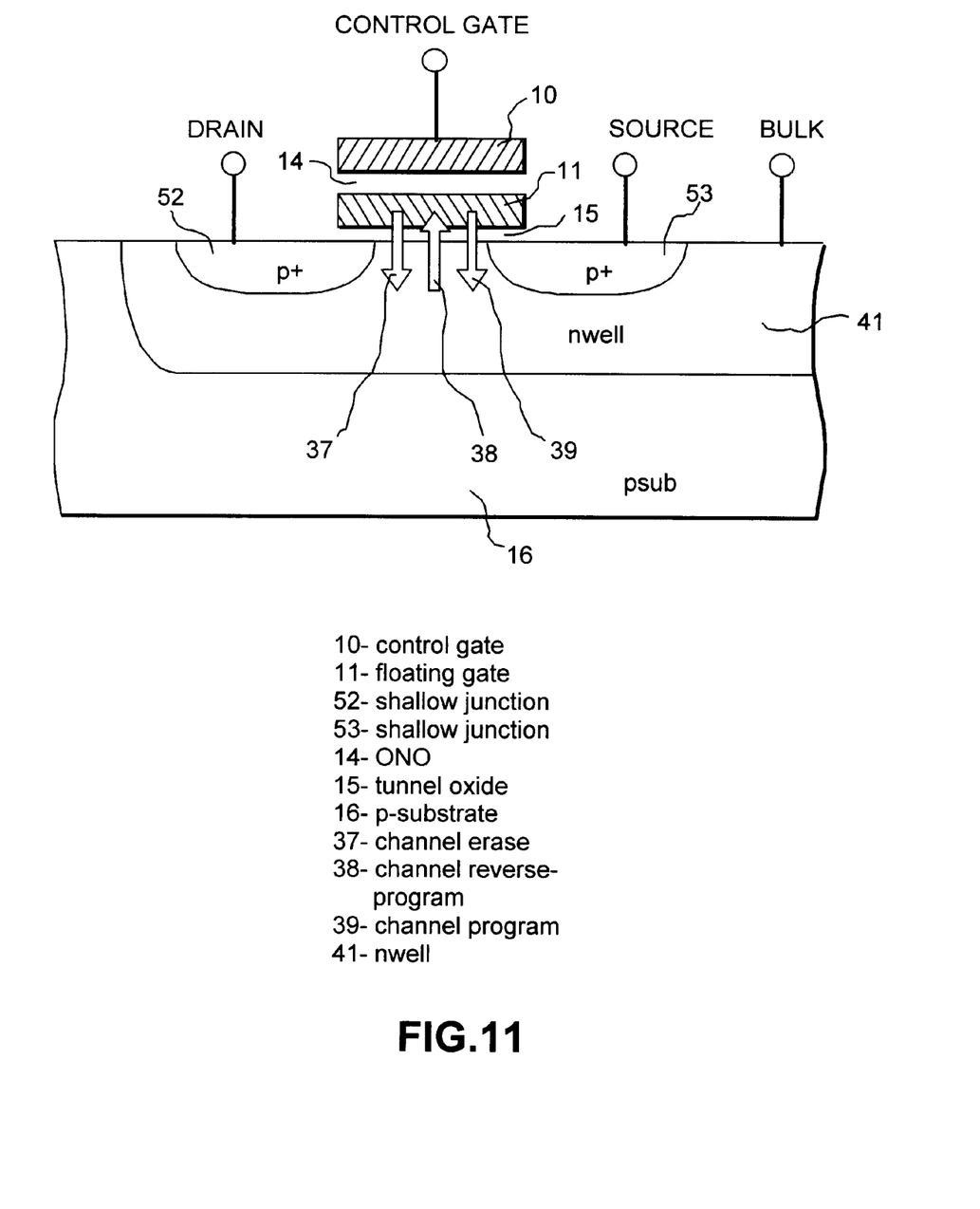
FIG. 11 is a sectional view of a nonvolatile, p+ memory cell of the present invention with an n-well and using channel erase, channel reverse program and channel program.

FIG. 10 and FIG. 11 show another embodiment of the present invention where the cell structures is formed on an n-substrate (17) or on an n-well (41) on a p-substrate (16) and employing the three step write method of present invention. Unlike N-type flash cells shown in FIG. 1–FIG. 9, the cells of FIG. 10 and FIG. 11 are both P-type flash EEPROM cells. The p+ source (53) and p+ drain (52), floating gate (11), control gate (10) and tunnel oxide (15) are formed in same manner like N-type flash cell with reverse polarity. In contrast to N-type cell operation, channel erase operation (37) is performed to extract electrons out from floating gate (11) by coupling control gate (10) with negative high voltage. After the channel-erase operation, the P-type cell is in an off-state. The channel reverse program (38) is performed to attract electrons from n-substrate (17) into floating gate (11) by coupling control gate (10) with a positive high voltage. Both P-type flash cells of FIG. 10 and FIG. 11 perform the three step operation as with the N-type cells of this invention to completely eliminate the over-erase problem. The three step operation starts with channel erase (37), then second, a channel reverse program (38) is performed, and finally ending with a channel program step. The P-type cells of the present invention are made fully symmetrical, thus the cell is highly scalable as is its N-type counterpart.

Figure 12A:
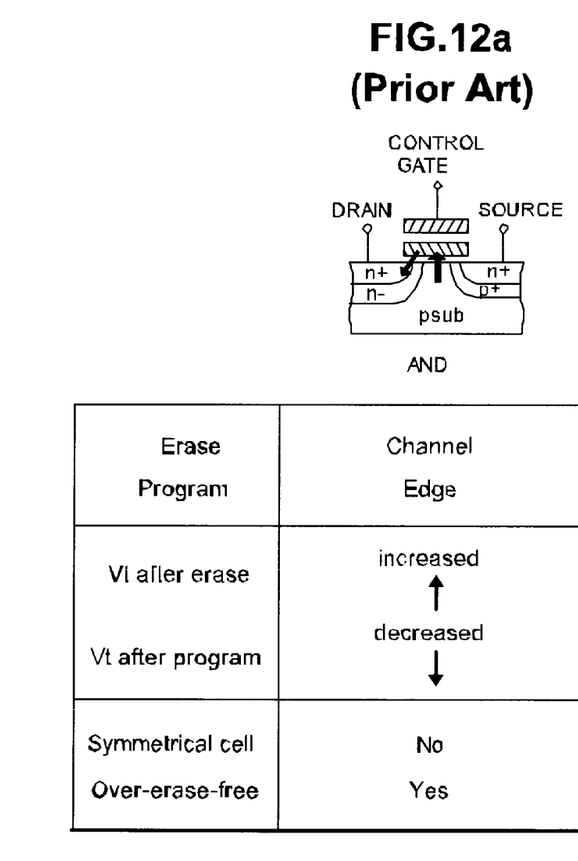
FIGS. 12A, B, and C compare a nonvolatile, AND type memory cell of prior art with a nonvolatile, OR type memory cell of the present invention.
Figure 12B:
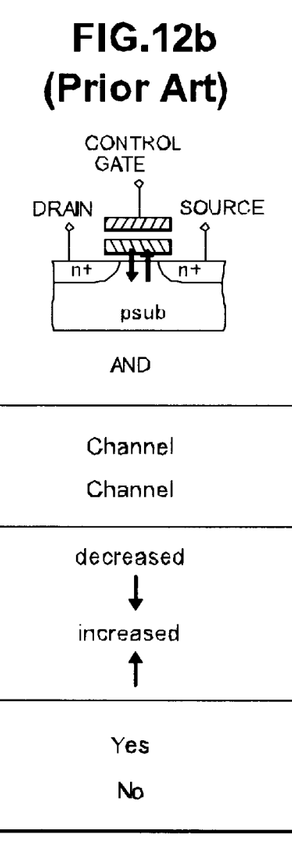
Figure 12C:
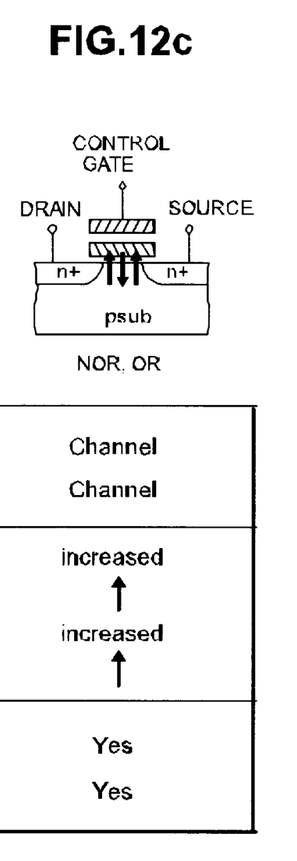

FIG. 12a, FIG. 12b and FIG. 12c summarize three different write operations including two prior art and the present invention. One unique feature of the present invention is that over-erase-free, channel-erase and channel-program operations have been achieved. In other words, the three step write method provides in one structure the combined advantages from a plurality of prior art as applied to NAND-like cell technology.

While the invention has been particularly shown and described with reference to preferred embodiments thereof, it will be understood by those skilled in the art that various changes in form and details may be made without departing from the spirit and scope of the invention.

What is claimed is:

1. A nonvolatile memory cell contained within an array with a three-step write operation, comprising:
   a) an array of flash memory cells, each cell containing a floating gate transistor,
   b) an erase operation applied to a block of said array to increase a threshold voltage of said transistor in each memory cell within said block,
   c) a reverse program operation applied to a page within said block to decrease said threshold voltage of said transistor in each memory cell within said page,
   d) a program operation applied to a selected memory cell within said page to increase the threshold voltage of said transistor in the selected memory cell,
   e) said erase operation turns off said transistor in each memory cell of the block thereby not requiring an over erase correction.

2. The memory cell of claim 1, wherein said transistor provides an "NOR" type symmetrical cell having an N-channel on a P-substrate and using said channel of said transistor for said erase, said reverse program and said program operations.

3. The memory cell of claim 1, wherein said transistor provides an "NOR" type symmetrical cell having an N-channel residing in a P+ diffusion on a P-substrate and using said channel of said transistor for said erase, said reverse program and said program operations.

4. The memory cell of claim 1, wherein said transistor provides an "NOR" type symmetrical cell having an N-channel residing in a P-well in an N-well on a P-substrate and using said channel of said transistor for said erase, said reverse program and said program operations.

5. The memory cell of claim 1, wherein said transistor provides an "OR" type symmetrical cell having an N-channel on a P-substrate and using said channel of said transistor for said erase, said reverse program and said program operations.

6. The memory cell of claim 1, wherein said transistor provides an "OR" type symmetrical cell having an N-channel residing in a P+ diffusion on a P-substrate and using said channel of said transistor for said erase, said reverse program and said program operations.

7. The memory cell of claim 1, wherein said transistor provides an "OR" type symmetrical cell having an N-channel residing in a P-well in an N-well on a P-substrate and using said channel of said transistor for said erase, said reverse program and said program operations.

8. The memory cell of claim 1, wherein said transistor provides an "ETOX" type symmetrical cell having an N-channel residing on a P-substrate, an N+ drain located over a P+ diffusion, an N+ source, using said channel for said erase and said reverse program operations and using said P+ diffusion for a channel hot electron (CHE) program operation.

9. The memory cell of claim 1, wherein said transistor provides an "ETOX" type symmetrical cell having an N-channel residing in a P-well that is on top of an N-well on a P-substrate, an N+ drain located over a P+ diffusion in said P-well, an N+ source in said P-well, using said channel for said erase and said reverse program operations and using said P+ diffusion for a channel hot electron (CHE) program operation.

10. The memory cell of claim 1, wherein said transistor is a P-channel symmetrical cell with said P-channel on an N-substrate and using said channel of said transistor for said erase, said reverse program and said program operations.

11. The memory cell of claim 1, wherein said transistor is a P-channel symmetrical cell with said P-channel residing in an N-well on a P-substrate and using said channel of said transistor for said erase, said reverse program and said program operations.

12. A three step method for programming a flash memory array, comprising:
   a) erasing a block of an array containing nonvolatile memory cells by increasing a threshold voltage of a single transistor within each cell of the block, turning off said transistor and not requiring an erase correction,
   b) reverse programming a page contained within said block by decreasing said threshold voltage of said single transistor within each memory cell of the page,
   c) programming a selected memory cell within said page by increasing said threshold voltage of said single transistor within the selected memory cell.

13. The method of claim 12, wherein said single transistor is an N-channel device residing on a P-substrate and using Fowler-Nordheim tunneling to erase, reverse program and program between a floating gate of said transistor and said N-channel.

14. The method of claim 13, wherein said single transistor resides on a P+ diffusion on said P-substrate.

15. The method of claim 13, wherein said single transistor resides in a P-well located within an N-well on a P-substrate.

16. The method of claim 12, wherein said cell is an "ETOX" type device residing on a P-substrate using Fowler-Nordheim tunneling to erase and reverse program said cell and using a channel hot electron (CHE) to program said cell.

17. The method of claim 16, wherein said cell resides in a P-well located within an N-well on said P-substrate.

18. The method of claim 12, wherein said single transistor is an P-channel device residing on an N-substrate and using Fowler-Nordheim tunneling to erase, reverse program and program between a floating gate of said transistor and said P-channel.

19. The method of claim 18, wherein said single transistor resides in an N-well on a P-substrate.

20. A single transistor nonvolatile memory cell, comprising:
   a) erasing means for increasing a threshold voltage of a transistor with a floating gate contained within each cell of a block of memory cells, turning off said transistor and thereby not requiring an over erase correction,
   b) reverse programming means for decreasing said threshold voltage of the transistor contained within a page of said block of memory cells,
   c) programming means for increasing said threshold voltage of the transistor contained within a selected cell of said page.

21. The memory cell of claim 20, wherein said means for erasing, reverse programming and programming is carried out between a floating gate and a channel of said transistor in an "NOR" type memory cell using Flowler-Nordheim tunneling.

22. The memory cell of claim 20, wherein said erasing means and said reverse programming means is carried out between a floating gate and a channel of said transistor in an "ETOX" type memory cell using Flowler-Nordheim tunneling, and said programming means uses channel hot electron (CHE).

* * * * *